(12) United States Patent
Ishikawa et al.

(10) Patent No.: US 11,196,405 B2
(45) Date of Patent: Dec. 7, 2021

(54) ELECTRONIC COMPONENT AND METHOD OF MANUFACTURING THE SAME

(71) Applicant: Murata Manufacturing Co., Ltd., Nagaokakyo (JP)

(72) Inventors: Kouji Ishikawa, Nagaokakyo (JP); Akio Katsube, Nagaokakyo (JP); Takehito Ishihara, Nagaokakyo (JP); Takeshi Ono, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 958 days.

(21) Appl. No.: 15/877,746

(22) Filed: Jan. 23, 2018

(65) Prior Publication Data

US 2018/0159501 A1 Jun. 7, 2018

Related U.S. Application Data

(63) Continuation of application No. PCT/JP2016/071415, filed on Jul. 21, 2016.

(30) Foreign Application Priority Data

Jul. 31, 2015 (JP) .............................. JP2015-152185

(51) Int. Cl.
*H03H 9/10* (2006.01)
*H03H 3/02* (2006.01)
(Continued)

(52) U.S. Cl.
CPC ............ *H03H 9/1021* (2013.01); *H03H 3/02* (2013.01); *H03H 9/0519* (2013.01);
(Continued)

(58) Field of Classification Search
CPC .............. H03H 9/1021; H03H 9/0519; H03H 2003/022; H03H 2003/027; H03H 9/1057
See application file for complete search history.

(56) References Cited

U.S. PATENT DOCUMENTS 6,344,424 B1 2/2002 Goto et al.
9,688,879 B2 6/2017 Takahashi et al.
(Continued)

FOREIGN PATENT DOCUMENTS

JP 2000-40762 A 2/2000
JP 2000-232332 A 8/2000
(Continued)

OTHER PUBLICATIONS

English Translation of JP 2000040762 (Year: 2000).*
(Continued)

*Primary Examiner* — Bryan P Gordon
(74) *Attorney, Agent, or Firm* — Arent Fox LLP

(57) ABSTRACT

An electronic component that includes an electronic element; a base member having an upper surface on which the electronic element is mounted; and a lid member bonded to the base member via a bonding member such that the electronic element is hermetically sealed therebetween. The bonding member is made of an insulating material containing a first metal. The lid member has an outermost layer formed on at least a surface of the lid member facing the base member. The outermost layer of the lid member has a solid solution layer of the first metal and a second metal at at least a portion of the outermost layer.

20 Claims, 6 Drawing Sheets

(51) Int. Cl.
  *H03H 9/05* (2006.01)
  *H03H 9/17* (2006.01)
  *H03H 9/15* (2006.01)
(52) U.S. Cl.
  CPC .......... *H03H 9/1057* (2013.01); *H03H 9/176* (2013.01); *H03H 2003/022* (2013.01); *H03H 2003/027* (2013.01); *H03H 2009/155* (2013.01)

(56) References Cited

U.S. PATENT DOCUMENTS

| | | | |
|---|---|---|---|
| 2011/0174533 A1* | 7/2011 | Nagano | H03H 9/1021 174/520 |
| 2013/0106247 A1* | 5/2013 | Ariji | H03H 9/15 310/348 |
| 2014/0003004 A1* | 1/2014 | Kamakura | H05K 1/18 361/748 |
| 2014/0240905 A1* | 8/2014 | Takahashi | H05K 5/062 361/679.01 |
| 2014/0292143 A1 | 10/2014 | Ichikawa | |

FOREIGN PATENT DOCUMENTS

| | | |
|---|---|---|
| JP | 2001-156197 A | 6/2001 |
| JP | 2002-26679 A | 1/2002 |
| JP | 2004-231677 A | 8/2004 |
| JP | 2006-222522 A | 8/2006 |
| JP | 2014-187341 A | 10/2014 |
| JP | 2014-197615 A | 10/2014 |

OTHER PUBLICATIONS

English Translation of JP 2001156197 (Year: 2001).*
English Translation f JP 2000134055 (Year: 2001).*
International Search Report issued in International Application No. PCT/JP2016/071415, dated Oct. 25, 2016.
Written Opinion of the International Searching Authority issued in International Application No. PCT/JP2016/071415, dated Oct. 25, 2016.

* cited by examiner

ELECTRONIC COMPONENT AND METHOD OF MANUFACTURING THE SAME

CROSS REFERENCE TO RELATED APPLICATIONS

The present application is a continuation of International application No. PCT/JP2016/071415, filed Jul. 21, 2016, which claims priority to Japanese Patent Application No. 2015-152185, filed Jul. 31, 2015, the entire contents of each of which are incorporated herein by reference.

FIELD OF THE INVENTION

The present invention relates to an electronic component and a method of manufacturing the electronic component.

BACKGROUND OF THE INVENTION

As an embodiment of a piezoelectric vibration device used for an oscillation device or a band pass filter, a piezoelectric-vibration-device package is known in which, by bonding a metal lid (lid member) to a ceramic base member, a piezoelectric vibrator is hermetically sealed in the inner space (see Patent Document 1). While the piezoelectric vibrator is likely influenced by the outside air, the influence by the outside air is blocked by hermetically sealing the piezoelectric vibrator, and hence a variation in characteristics of the piezoelectric vibrator can be restricted. For bonding between the base member and the lid member, metal bonding or sealing with a low-melting glass is used (see paragraph [0022], etc. of Patent Document 1). With the bonding, the piezoelectric vibrator can be hermetically sealed at low cost.

However, regarding the conventional bonding using an insulating material such as the low-melting glass, the bonding strength between the base member and the lid member has not been high. In particular, when the lid member is made of a metal material, adhesion between glass and metal has not been good, and stable and proper hermetical sealing could not have been occasionally obtained.

Patent Document 1: Japanese Unexamined Patent Application Publication No. 2002-26679

SUMMARY OF THE INVENTION

The present invention is made in light of the situations, and it is an object of the present invention to provide an electronic component capable of increasing reliability by increasing the bonding strength of a package, and a method of manufacturing the electronic component.

An electronic component according to an aspect of the present invention includes an electronic element; a base member having an upper surface on which the electronic element is mounted; and a lid member bonded to the base member via a bonding member in a manner that the electronic element is hermetically sealed therebetween. The bonding member is made of an insulating material containing a first metal. The lid member has an outermost layer formed on at least a surface of the lid member facing the base member. The outermost layer of the lid member has a solid solution layer of the first metal and a second metal at at least a portion of the outermost layer.

With the above-described configuration, the outermost layer of the lid member has the solid solution layer of the first metal contained in the bonding member and the second metal. Accordingly, the bonding strength between the lid member and the bonding member can be increased. Thus, the bonding strength of the package and the sealability of the electronic element can be increased. Therefore, the electronic component with high reliability can be provided.

In the above-described electronic component, the solid solution layer may be formed in a manner that the first metal of the bonding member is diffused in the outermost layer.

In the above-described electronic component, the solid solution layer may be formed in a region of the outermost layer of the lid member which contacts the bonding member.

In the above-described electronic component, the electronic element may be a piezoelectric vibrator.

In the above-described electronic component, an inner space that is defined between the base member and the lid member may have a pressure lower than an atmospheric pressure, and the piezoelectric vibrator may be hermetically sealed in that inner space.

In the above-described electronic component, an inner space that is defined between the base member and the lid member may be a vacuum, and the piezoelectric vibrator may be hermetically sealed in that inner space.

In the above-described electronic component, the insulating material may be a glass material.

In the above-described electronic component, the bonding member may be a lead free material.

In the above-described electronic component, the bonding member may be in the form of a fillet.

In the above-described electronic component, the lid member may further have a base layer, and a buffer layer formed between the base layer and the outermost layer.

In the above-described electronic component, the base layer of the lid member may be made of a metal.

In the above-described electronic component, the lid member may be formed in a recessed shape open to the upper surface of the base member.

In the above-described electronic component, the lid member may have a flange portion extending from an opening edge in a direction away from a center of the lid member.

In the above-described electronic component, the base member may be formed in a flat plate shape.

In the above-described electronic component, the first metal may be silver.

In the above-described electronic component, the second metal may be gold or palladium.

A method of manufacturing an electronic component according to another aspect of the present invention includes (a) preparing a base member with an electronic element mounted on an upper surface of the base member, and a lid member; (b) arranging the electronic element in an inner space that is defined by the lid member and the base member, by mounting the lid member on the upper surface of the base member via a bonding member; and (c) bonding the lid member to the base member via the bonding member by hardening the bonding member. The bonding member is made of an insulating material containing a first metal. The lid member has an outermost layer formed on at least a surface of the lid member facing the base member and containing a second metal. During the bonding of the lid member, a solid solution layer at at least a portion of the outermost layer is formed by diffusing the first metal of the bonding member in the second metal of the outermost layer.

With the above-described configuration, since the solid solution layer is formed by diffusing the first metal component in the insulating material of the bonding member in the second metal of the outermost layer of the lid member, the bonding strength between the lid member and the bonding member can be increased. Thus, the bonding strength of the package and the sealability of the electronic element can be increased. Therefore, the electronic component with high reliability can be manufactured.

In the above-described method of manufacturing the electronic component, the solid solution layer is formed in a region of the outermost layer of the lid member which contacts the bonding member.

In the above-described method of manufacturing the electronic component, the bonding member may be hardened in a pressure state lower than an atmospheric pressure.

In the above-described method of manufacturing the electronic component, the bonding member may be hardened in a vacuum state.

With the present invention, the reliability can be increased by increasing the bonding strength of the package.

DETAILED DESCRIPTION OF THE PREFERRED EMBODIMENTS

Figure 1:
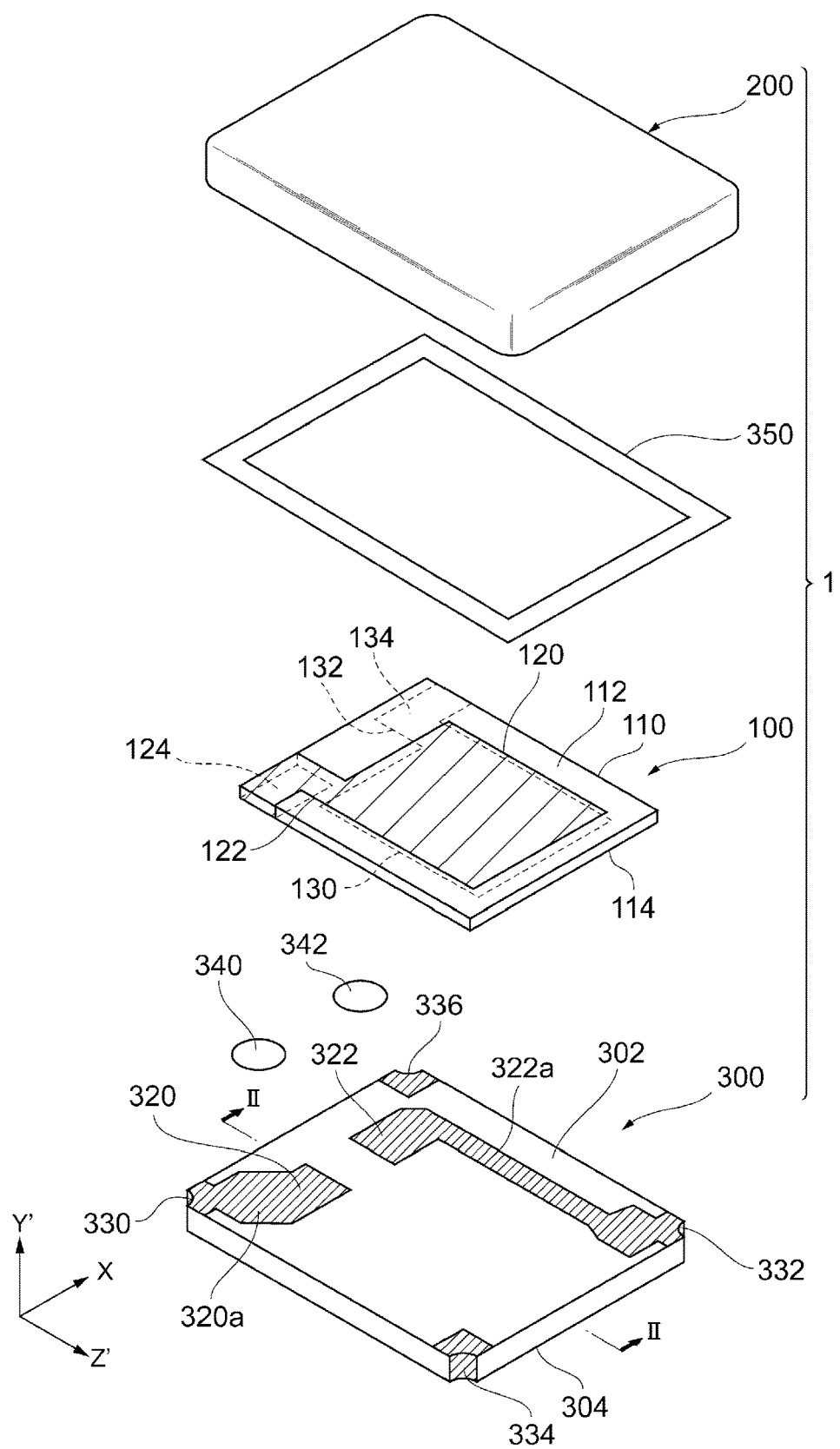
FIG. 1 is an exploded perspective view of an electronic component according to an embodiment of the present invention.

An embodiment of the present invention is described below. In the drawings, the same or like component is expressed by the same or like reference sign. The drawings are merely examples, the dimensions and shapes of respective components are merely schematic, and the technical scope of the present invention of this application should not be limitedly interpreted according to the embodiment.

An electronic component according to an embodiment of the present invention is described with reference to FIGS. 1 and 2. The electronic component is manufactured by a method which will be described later. A piezoelectric vibration device is described below as an example of an electronic component according to the present invention. The piezoelectric vibration device includes a piezoelectric vibrator as an example of an electronic element.

FIG. 1 is an exploded perspective view of the piezoelectric vibration device. FIG. 2 is a cross-sectional view taken along line II-II in FIG. 1. FIG. 2 omits illustration of various electrodes of the piezoelectric vibrator.

As illustrated in FIG. 1, a piezoelectric vibration device 1 according to this embodiment includes a piezoelectric vibrator 100, a cap 200 being an example of a lid member, and a substrate 300 being an example of a base member. The cap 200 and the substrate 300 define a case or a package for housing the piezoelectric vibrator 100.

The piezoelectric vibrator 100 includes a piezoelectric substrate 110, and first and second excitation electrodes 120 and 130 formed on the piezoelectric substrate 110. The first excitation electrode 120 is formed on a first surface 112 of the piezoelectric substrate 110, and the second excitation electrode 130 is formed on a second surface 114 opposite to the first surface 112 of the piezoelectric substrate 110.

The piezoelectric vibrator 100 is formed of a predetermined piezoelectric material, and its material is not particularly limited. In the example in FIG. 1, the piezoelectric vibrator 100 is a crystal vibrator having the piezoelectric substrate 110 being an AT-cut crystal substrate. When Y and Z axes of X, Y, and Z axes being crystal axes of artificial crystal are rotated by 35 degrees 15 minutes around the X axis in a direction from the Y axis to the Z axis, and the rotated axes are assumed as Y' axis and Z' axis, the AT-cut crystal substrate is cut out to have surfaces parallel to a plane that is specified by the X axis and the Z' axis (hereinafter, referred to as "XZ' plane," other planes specified by other axes are also named likewise) as principal surfaces. In the example in FIG. 1, the piezoelectric substrate 110 being the AT-cut crystal substrate has a long-side direction parallel to the Z'-axis direction, a short-side direction parallel to the X-axis direction, and a thickness direction parallel to the Y'-axis direction. The piezoelectric substrate 110 has a substantially rectangular shape in the XZ' plane. A crystal vibrator using the AT-cut crystal substrate has markedly high frequency stability in a wide temperature range, has good time-varying characteristics, and can be manufactured at low cost. Also, an AT-cut crystal vibrator uses in many cases a thickness shear mode as main vibration.

The piezoelectric substrate according this embodiment is not limited to the above-described configuration. For example, an AT-cut crystal substrate having a long-side direction parallel to the X-axis direction and a short-side direction parallel to the Z'-axis direction may be applied, a crystal substrate obtained by cutting different from AT cutting may be applied, or a piezoelectric material such as ceramics other than crystal may be applied.

The first excitation electrode 120 is formed on the first surface 112 (XZ' plane on Y'-axis positive side) of the piezoelectric substrate 110, and the second excitation electrode 130 is formed on the second surface 114 (that is, XZ' plane on Y'-axis negative side) opposite to the first surface 112 of the piezoelectric substrate 110. The first and second excitation electrodes 120 and 130 are a pair of electrodes, and have mutually overlapping portions in the XZ' plane.

On the piezoelectric substrate 110, a connection electrode 124 electrically connected to the first excitation electrode 120 via an extended electrode 122, and a connection electrode 134 electrically connected to the second excitation electrode 130 via an extended electrode 132 are formed. Specifically, the extended electrode 122 is extended on the first surface 112 from the first excitation electrode 120 toward a short side on the Z'-axis negative side, passes a side surface on the Z'-axis negative side of the piezoelectric substrate 110, and is connected to the connection electrode 124 formed on the second surface 114. The extended electrode 132 is extended on the second surface 114 from the second excitation electrode 130 toward the short side on the Z'-axis negative side, and is connected to the connection electrode 134 formed on the second surface 114. The connection electrodes 124 and 134 are arranged along the short sides on the Z'-axis negative side. The connection electrodes 124 and 134 have electrical conduction with the substrate 300 and are mechanically held by the substrate 300 via electrically conductive adhesives 340 and 342, which will be described later. In this embodiment, the arrangements and pattern shapes of the connection electrodes 124 and 134, and the extended electrodes 122 and 132 are not limited thereto, and may be appropriately changed with regard to electrical connection with other members.

The above-described respective electrodes including the first and second excitation electrodes 120 and 130 each may be formed such that a base layer thereof is formed of a chromium (Cr) layer and a gold (Au) layer is formed on a surface of the chromium layer. The materials are not limited thereto.

The cap 200 has a recessed portion 204 open to a first surface 302 of the substrate 300. The recessed portion 204 has an edge portion 202 formed to stand from a bottom surface of the recessed portion 204 along the entire periphery of the opening. The edge portion 202 has an end surface 205 facing the first surface 302 of the substrate 300. As illustrated in FIG. 2, the end surface 205 may be a tip end surface of the edge portion 202 that protrudes substantially perpendicularly from the bottom surface of the recessed portion 204.

The material of the cap 200 is not particularly limited. For example, the cap 200 may be formed of metal. Accordingly, by electrically connecting the cap 200 to the ground potential, a shield function can be added. The configuration of the cap 200 will be described later.

The piezoelectric vibrator 100 is mounted on the first surface 302 (upper surface) of the substrate 300. In the example in FIG. 1, the substrate 300 has the long-side direction parallel to the Z'-axis direction, the short-side direction parallel to the X-axis direction, and the thickness direction parallel to the Y'-axis direction. The substrate 300 has the substantially rectangular shape in the XZ' plane. The substrate 300 may be formed of, for example, insulating ceramics. For example, the substrate 300 may be formed by stacking and firing a plurality of insulating ceramic sheets. Alternatively, the substrate 300 may be formed of, for example, a glass material, a crystal material, or glass epoxy resin. The substrate 300 is preferably formed of a heat-resistant material. The substrate 300 may be composed of a single layer or a plurality of layers. If the substrate 300 is composed of a plurality of layers, the substrate 300 may include an insulating layer formed on the outermost layer of the first surface 302. Also, the substrate 300 may have a flat plate shape, or a recess shape open to the cap 200. As illustrated in FIG. 2, since both the cap 200 and the substrate 300 are bonded to one another by using a bonding member 350, the piezoelectric vibrator 100 is hermetically sealed in an inner space (cavity) 206 surrounded by the recessed portion 204 of the cap 200 and the substrate 300.

The bonding member 350 is provided on the entire circumference of the cap 200 or the substrate 300. The bonding member 350 is present between the end surface 205 of the edge portion 202 of the cap 200 and the first surface 302 of the substrate 300. The bonding member 350 contains an insulating material. The insulating material may be, for example, a glass material (for example, low-melting glass), or a resin material (for example, epoxy-based resin). By using such an insulating material, the cost is lower than that in case of metal bonding, the heating temperature can be suppressed, and hence the manufacturing process can be simplified. The bonding member 350 in this embodiment contains a metal component in the insulating material, which will be described later.

Figure 2:
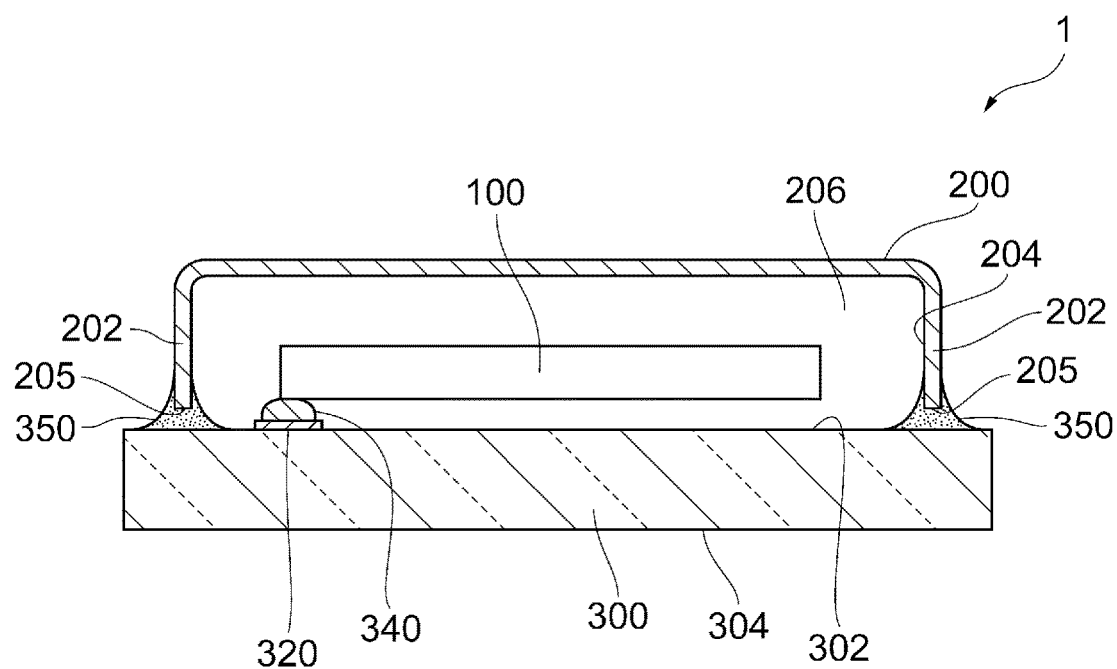
FIG. 2 is a cross-sectional view taken along line II-II in FIG. 1.

In the example illustrated in FIG. 2, the piezoelectric vibrator 100 has one end (an end portion on the electrically conductive adhesives 340 and 342 side) being a fixed end, and the other end being a free end. For a modification, the piezoelectric vibrator 100 may be fixed to the substrate 300 at both ends in the long-side direction.

As illustrated in FIG. 1, the substrate 300 includes connection electrodes 320 and 322 formed on the first surface 302, and extended electrodes 320a and 322a extended from the connection electrodes 320 and 322 to outer edges of the first surface 302. The connection electrodes 320 and 322 are arranged at the inner side with respect to the outer edges of the substrate 300 so that the piezoelectric vibrator 100 can be arranged substantially at the center of the first surface 302 of the substrate 300.

The connection electrode 124 of the piezoelectric vibrator 100 is connected to the connection electrode 320 via the electrically conductive adhesive 340. The connection electrode 134 of the piezoelectric vibrator 100 is connected to the connection electrode 322 via the electrically conductive adhesive 342.

The extended electrode 320a is extended from the connection electrode 320 to one corner portion of the substrate 300. The extended electrode 322a is extended from the connection electrode 322 to another corner portion of the substrate 300. Also, a plurality of outer electrodes 330, 332, 334, and 336 are formed at respective corner portions of the substrate 300. In the example illustrated in FIG. 1, the extended electrode 320a is connected to the outer electrode 330 formed at the corner portion on the X-axis negative side and the Z'-axis negative side. The extended electrode 322a is connected to the outer electrode 332 formed at the corner portion on the X-axis positive side and the Z'-axis positive side. Also, as illustrated in FIG. 1, the outer electrodes 334 and 336 may be formed at the residual corner portions. These outer electrodes may be dummy patterns that are not electrically connected to the piezoelectric vibrator 100. By forming such dummy patterns, an electrically conductive material for forming the outer electrodes can be easily applied, and the outer electrodes can be formed at all corner portions. Accordingly, a processing step of electrically connecting a piezoelectric vibration device to another member is easily performed. Further, the outer electrodes 334 and 336 serving as the dummy patterns may be ground electrodes that are electrically connected to the ground potential. If the cap 200 is electrically conductive, by connecting the cap 200 to the outer electrodes 334 and 336 being the ground electrodes, the cap 200 can additionally have a shield function.

In the example illustrated in FIG. 1, the corner portions of the substrate 300 have cut side surfaces formed by cutting to partly have cylindrical curved-surface shapes (also called castellation shapes). The outer electrodes 330, 332, 334, and 336 are continuously formed from such cut side surfaces to a second surface 304. The shapes of the corner portions of the substrate 300 are not limited thereto. The cut shapes may be flat-surface shapes, or the corner portions may have corners without cutting.

The configurations of the connection electrodes, extended electrodes, and outer electrodes of the substrate 300 are not limited to the above-described example configurations, and may be modified in various ways and applied. The connection electrodes 320 and 322 may be arranged on mutually different sides on the first surface 302 of the substrate 300. For example, one of the connection electrodes 320 and 322 may be formed on the Z'-axis positive side and the other may be formed on the Z'-axis negative side. With this configuration, the piezoelectric vibrator 100 is supported by the substrate 300 at both one end and the other end thereof in the long-side direction. Also, the number of the outer electrodes is not limited to four. For example, two outer electrodes may be arranged in a diagonal line. The outer electrodes are not limited to ones arranged at the corner portions, and may be formed on any of side surfaces of the substrate 300 other than the corner portions. In this case, as described above, cut side surfaces may be formed by cutting portions of side surfaces in cylindrical curved-surface shapes, and outer electrodes may be formed on the side surfaces other than the corner portions. Further, the other outer electrodes 334 and 336 serving as dummy patterns may not be formed. A through hole extending from the first surface 302 to the second surface 304 may be formed in the substrate 300. The connection electrodes formed on the first surface 302 may be electrically conducted with the second surface 304 via the through hole.

In the piezoelectric vibration device 1 as illustrated in FIG. 1, by applying an alternating voltage between the pair of first and second excitation electrodes 120 and 130 of the piezoelectric vibrator 100 via the outer electrodes 330 and 332, the piezoelectric substrate 110 vibrates in a predetermined vibration mode such as a thickness shear mode, and resonance characteristics caused by the vibration are obtained.

Figure 3:
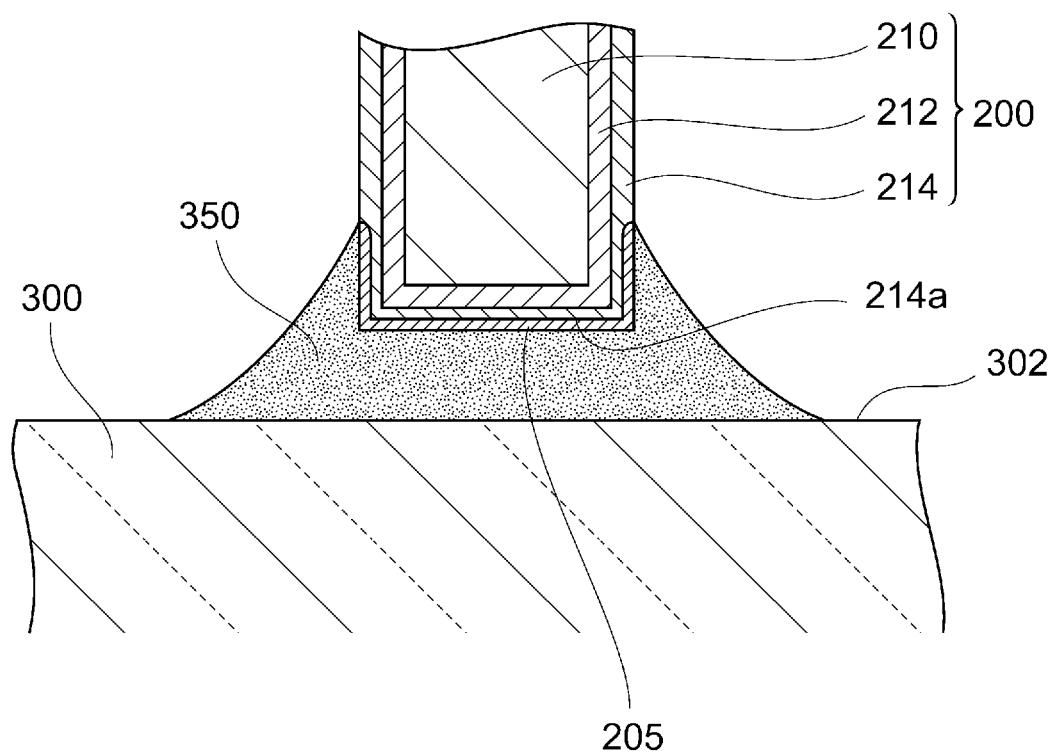
FIG. 3 is a partly enlarged view of FIG. 2.

The respective configurations of the cap 200 and the bonding member 350 are described next in further detail with reference to FIG. 3. FIG. 3 is an enlarged view of the bonding member 350 that bonds both the cap 200 and the substrate 300 in FIG. 2.

The bonding member 350 is made of an insulating material containing a component of silver (Ag) being an example of a first metal. The bonding member 350 provides, when the cap 200 and the substrate 300 are bonded to one another, a property of electrical insulation between the cap 200 and the substrate 300. In the present invention, the "insulating material" represents a material having a resistivity of about $1\times10^5$ [Ω·m] or higher. The insulating material of the bonding member 350 may be, for example, a glass material containing a component of the first metal. Specifically, the insulating material of the bonding member 350 may be a vanadium-based low-melting glass containing a silver component. For example, if the insulating material is a low-melting glass, the resistivity of the material may be, for example, about $1\times10^6$ [Ω·m]. The bonding member 350 may be lead-free. The bonding member 350 may be an insulating material containing a metal component other than the component of the first metal.

As illustrated in FIG. 3, the cap 200 includes a base member 210, a buffer layer 212 formed on a surface of the base member 210, and an outermost layer 214 formed on a surface of the buffer layer 212. The base member 210 may be formed of, for example, an alloy (for example, 42 alloy) containing iron (Fe) and nickel (Ni). The buffer layer 212 may use a metal appropriate as a base layer of the outermost layer 214. For example, the buffer layer 212 may be made of nickel (Ni).

In this embodiment, the outermost layer 214 has a solid solution layer 214a containing the first metal having the same component as that of the first metal in the insulating material of the bonding member 350, and the second metal. The solid solution layer 214a is formed in a manner that the component of the first metal of the bonding member 350 is diffused in the outermost layer 214. In the example illustrated in FIG. 3, the solid solution layer 214a is formed at a portion of the outermost layer 214 in the thickness direction, that is, a portion of the outermost layer 214 on the end surface 205 side facing the first surface 302 of the substrate 300, and side surfaces of the edge portion 202 of the cap 200 (that is, regions that contact the bonding member 350). In this case, the residual portion of the outermost layer 214 is formed of the second metal. Alternatively, unlike the example illustrated in FIG. 3, the solid solution layer 214a may be entirely formed in the thickness direction of the outermost layer 214.

As described above, according to this embodiment, since the solid solution layer 214a formed in a manner that the first metal component of the bonding member 350 is diffused in the outermost layer 214 of the cap 200 is included, the bonding strength between the cap 200 and the bonding member 350 can be increased. This point is described further in detail when the manufacturing method is described.

Also, as illustrated in FIG. 3, the bonding member 350 may form a fillet on the side surfaces of the edge portion 202 of the cap 200. With this formation, the contact area between the outermost layer 214 of the cap 200 and the bonding member 350 is increased, the area of the solid solution layer 214a in the outermost layer 214 is increased, and hence the bonding strength between the cap 200 and the bonding member 350 is further increased.

The materials of the first and second metals may be appropriately selected from materials having a relationship that likely causes diffusion from the first metal to the second metal (and a relationship that likely forms a solid solution). If the first metal is silver (Ag), a representative example of the second metal may be gold (Au) or palladium (Pd).

A method of manufacturing an electronic component according to an embodiment of the present invention is described next with reference to a flowchart in FIG. 4. A method of manufacturing a piezoelectric vibration device is described below as an example of a method of manufacturing an electronic component according to the present invention.

Figure 4:
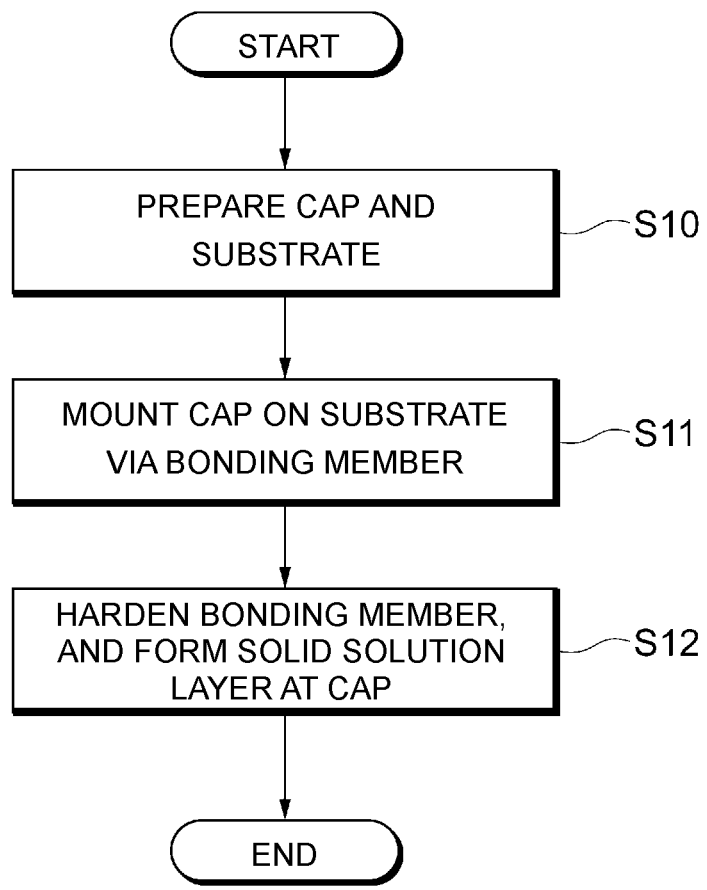
FIG. 4 is a flowchart showing a method of manufacturing the electronic component according to the embodiment of the present invention.

As shown in FIG. 4, the cap 200 and the substrate 300 are prepared (S10).

The substrate 300 being an example of a base member may be, for example, an insulating ceramic substrate. A predetermined electrode pattern, such as the connection electrodes and extended electrodes which have been described is formed on the first surface 302 of the substrate 300. The electrode pattern may be formed by applying an electrically conductive material in a paste form in a predetermined region and by firing the material. Alternatively, at least part of the electrode pattern may be formed by appropriately combining sputtering, vacuum deposition, or plating.

The piezoelectric vibrator 100 being an example of an electronic element is mounted on the first surface 302 of such a substrate 300. If the piezoelectric vibrator 100 is a crystal vibrator, the piezoelectric vibrator 100 is formed by cutting out a crustal material in a wafer shape at a predetermined cut angle from a rough of artificial crystal or natural crystal, forming predetermined rectangular outer shapes by dicing or etching, and then forming various electrodes, such as the first and second excitation electrodes 120 and 130, thereon, for example, by sputtering or vacuum deposition. The piezoelectric vibrator 100 can be electrically connected to the connection electrode 320 and 322 of the substrate 300 via the electrically conductive adhesives 340 and 342.

The piezoelectric vibrator 100 may be mounted on each of substrates 300 of individual pieces obtained by dividing the wafer-shaped substrate, or may be mounted on each of regions of the wafer-shaped substrate. If the piezoelectric vibrator 100 is mounted on each of the regions of the wafer-shaped substrate, the substrates 300 are divided into individual pieces on the piezoelectric vibrator 100 basis in a later step.

The cap 200 being an example of a lid member is, for example, formed in a recess shape open to the first surface 302 of the substrate 300. An outermost layer is formed on at least a surface thereof facing the substrate 300 (for example, the end surface 205). The outermost layer in this phase (that is, a precursor layer in a phase before the outermost layer 214a in FIG. 3 is formed) is formed of the second metal (for example, gold or palladium). For example, the buffer layer 212 made of nickel may be formed on the surface of the base member 210 of the cap 200 by nickel plating, and the outermost layer 214 made of gold or palladium may be formed on the surface of the buffer layer 212 by gold plating or palladium plating.

Then, the cap 200 is mounted on the substrate 300 via the bonding member 350 (S11).

Specifically, the bonding member 350 is provided on one of the cap 200 and the substrate 300, or on each of both, and hence the cap 200 is mounted on the first surface 302 of the substrate 300 via the bonding member 350. In this way, the piezoelectric vibrator 100 can be arranged in the inner space 206 defined by the cap 200 and the substrate 300.

Then, the bonding member 350 is hardened and the solid solution layer 214a is formed on the cap 200 (S12).

Specifically, the bonding member 350 is heated. If the bonding member 350 is a low-melting glass, the glass material is fired, for example, by heating the glass material at about 300° C. to about 320° C. for about 10 minutes. Accordingly, the bonding member 350 is hardened and the piezoelectric vibrator 100 can be hermetically sealed in the inner space 206. Also, the first metal component contained in the insulating material of the bonding member 350 is diffused by heat to the second metal of the outermost layer 214 of the cap 200. Accordingly, the solid solution layer 214a is formed at at least a portion of the outermost layer 214 of the cap 200. Step (S12) may be executed under a vacuum environment or a pressure environment lower than the atmospheric pressure. Accordingly, the piezoelectric vibrator 100 can be hermetically sealed in the inner space 206 in a vacuum or with a pressure lower than the atmospheric pressure.

The solid solution layer is described further in detail. The solid solution layer 214a is likely formed as diffusion between the first and second metals likely occurs. The likelihood of the occurrence of diffusion is indicated by a diffusion coefficient. The solid solution layer 214a is more likely formed as the diffusion coefficient of the first metal with respect to the second metal is larger. Also, the thickness of the solid solution layer 214a is proportional to the square root of the diffusion coefficient. Hence, as the diffusion coefficient of the first metal with respect to the second metal is larger, the thickness of the solid solution layer 214a is increased, and the bonding strength between the cap 200 and the bonding member 350 can be increased.

Generally, a diffusion coefficient D [m²/s] can be derived from the Arrhenius equation as follows:

$$D=D_0 \times \exp(-Q/RT),$$

where $D_0$ [m²/s] is a frequency term, Q [kJ/mol] is an activation energy with respect to a metal to be diffused, R is a gas constant, and T [K] is a temperature during diffusion.

In the above equation, if calculation is performed at a temperature of 300 [° C.], the values of diffusion coefficients for a diffusion coefficient D1 of silver with respect to gold and a diffusion coefficient D2 of silver with respect to nickel are obtained as follows:

$$D1=6.93 \times 10^{-6} \text{ [m}^2\text{/s], and}$$

$$D2=9.72 \times 10^{-8} \text{ [m}^2\text{/s]}.$$

Comparing both the diffusion coefficients with one another, a relationship is established as follows:

$$D1>D2.$$

Regarding this, it is found that the diffusion coefficient D1 of silver with respect to gold is about 100 times larger than the diffusion coefficient D2 of silver with respect to nickel. That is, diffusion of silver with respect to gold more likely occurs about 100 times as compared with diffusion of silver with respect to nickel, and hence the solid solution layer 214a is more likely formed.

Figure 5:
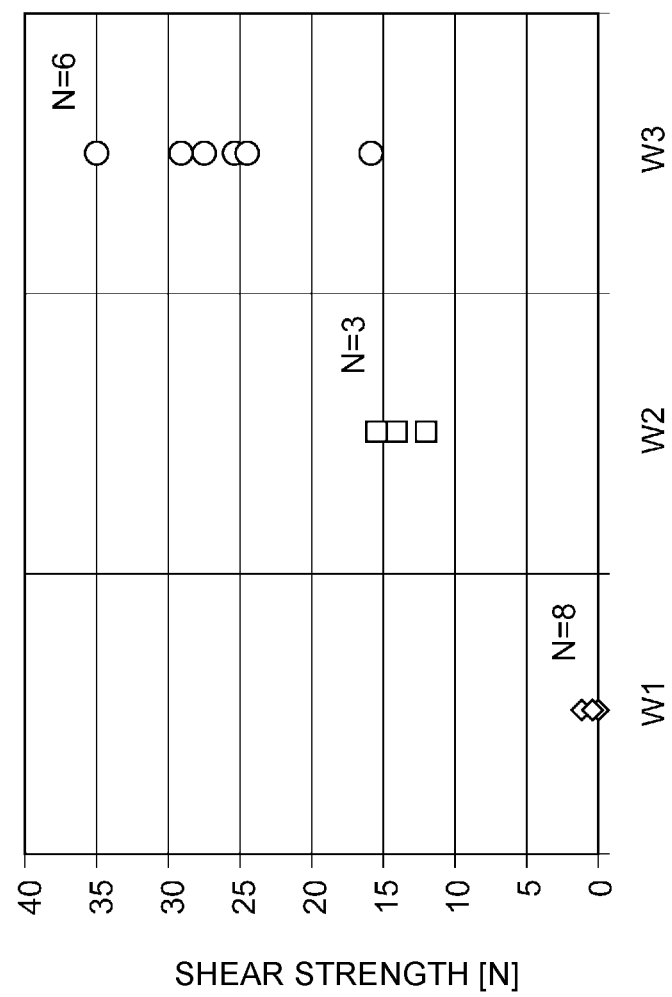
FIG. 5 illustrates experiment data when the bonding strength of the electronic component according to the embodiment of the present invention was measured.

A graph in FIG. 5 shows a result of measurement on the shear strengths of workpieces W1 to W3 manufactured by using the method of manufacturing the electronic component according to the embodiment of the present invention. Specifically, outermost layers before bonding of the cap using three types of metals were prepared, and workpieces W1 to W3 were obtained by thermally hardening a low-melting glass containing a silver component. The shear strengths of the workpieces W1 to W3 each were measured. Regarding the metal of the outermost layer before bonding of the cap for each workpiece, the workpiece W1 uses nickel, the workpiece W2 uses gold, and the workpiece W3 uses palladium. The number of plots in the drawing represents the number (N) of workpieces of each of the workpieces W1, W2, and W3.

The average values of the shear strengths [N] of the workpieces W1, W2, and W3 were as follows:

W1 (silver, nickel)=0.69 [N],

W2 (silver, gold)=14.08 [N], and

W3 (silver, palladium)=26.52 [N].

Also, one using gold was prepared as an outermost layer before bonding of the cap, and a workpiece W4 obtained by thermally hardening a low-melting glass not containing a silver component (vanadium-based low-melting glass) was manufactured. The shear strength of the workpiece W4 was measured. The average value of the shear strength [N] of the workpiece W4 was as follows. It is to be noted that the number of measured pieces of the workpiece W4 was N=3.

W4 (no silver, gold)=0.54 [N]

Comparing both the shear strengths of the respective workpieces, a relationship is established as follows:

$$W3>W2>W1 \approx W4.$$

It is to be noted that the shear strength measurement conditions are as follows.

Measurement device: bondtester (Series 4000 manufactured by Dage)

Tool width: 2000 μm

Test speed: 100 μm/s

It is found that the shear strength is low if the outermost layer before bonding of the cap 200 is nickel or the insulating material of the bonding member 350 does not contain a silver component (see average values of workpieces W1 and W4). In contrast, it is found that the shear strength is markedly increased if the outermost layer before bonding of the cap 200 is gold or palladium and the insulating material of the bonding member 350 contains a silver component (see average values of workpieces W2 and W3).

When the composition of the interface between the cap and the bonding member was analyzed by STEM (scanning transmission electron microscope) and EDX (energy-dispersive X-ray), it was recognized that a silver component in the insulating material of the bonding member is diffused in gold or palladium.

As described above, in the electronic component according to this embodiment, it is found that the first metal component contained in the insulating material of the bonding member 350 is diffused in the second metal of the outermost layer of the cap 200, hence the solid solution layer 214a is formed at at least a portion of the outermost layer 214 of the cap 200, and consequently, the bonding strength between the cap 200 and the bonding member 350 is increased.

With this embodiment, the outermost layer of the cap 200 has the solid solution layer 214a formed in a manner that the first metal component contained in the insulating material of the bonding member 350 is diffused in the second metal. Accordingly, the bonding strength between the cap 200 and the bonding member 350 can be increased. Thus, the bonding strength of the package and the sealability of the electronic element can be increased while a more simple manufacturing process with lower cost than the case of metal bonding (for example, Au—Sn alloy bonding) is attained. Therefore, the electronic component with higher reliability than that of related art can be provided.

The present invention is not limited to the above-described embodiment, and may be modified in various ways and applied. In the following description, the point different from the above-described content is described, and the same reference sign is applied to a configuration with the same content as described above in the drawings.

Figure 6:
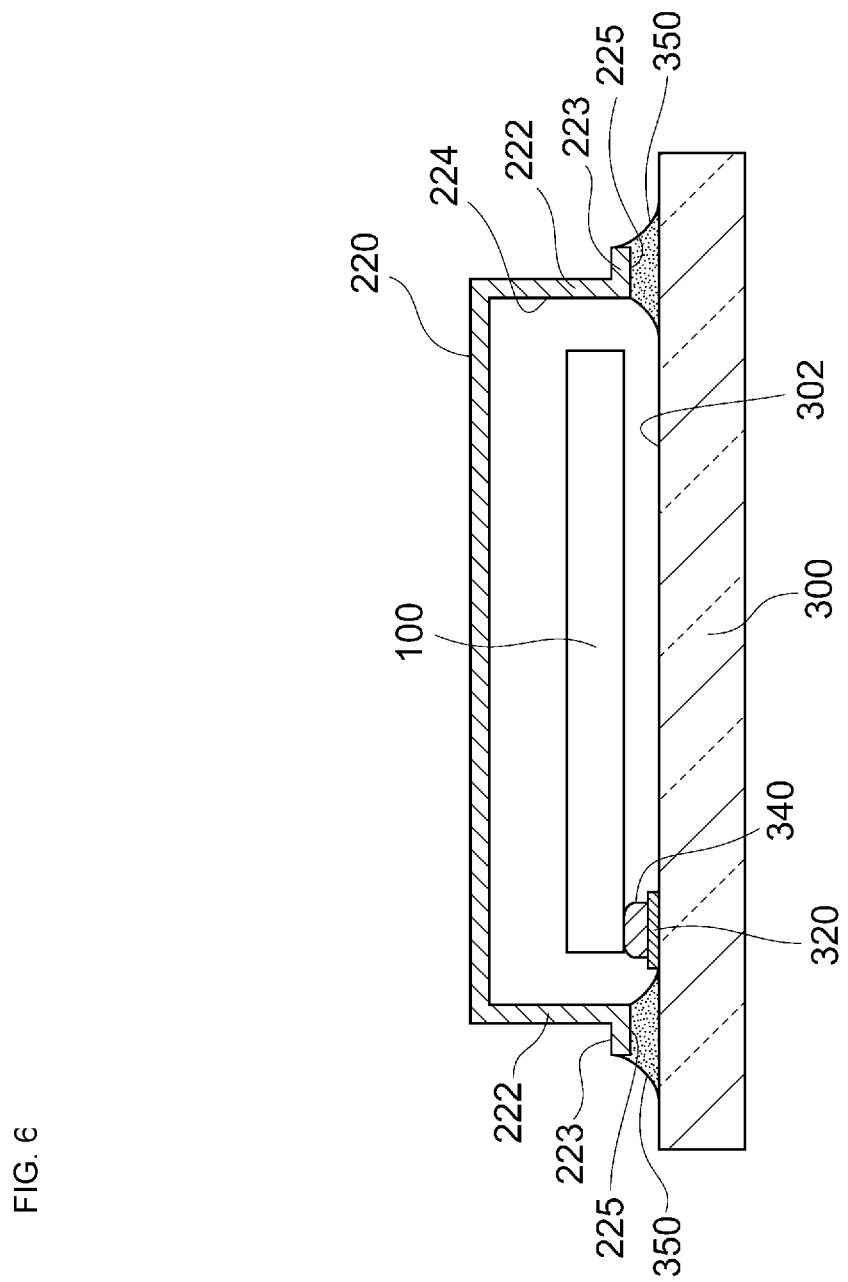
FIG. 6 is a cross-sectional view of an electronic component according to a modification of the embodiment of the present invention.

FIG. 6 is an illustration for explaining an electronic component according to this modification. Specifically, the configuration of a lid member differs from the above-described content.

In this modification, a cap 220 being an example of a lid member may have a flange portion 223 that, in a direction from the center of a recessed-portion opening toward an opening edge 222, protrudes from the opening edge 222. The flange portion 223 may have an end surface 225 facing the first surface 302 of the substrate 300. With this configuration, the contact area between the outermost layer (including the end surface 225) of the cap 200 and the bonding member 350 is increased, the area of the solid solution layer is increased, and hence the bonding strength between the cap 220 and the bonding member 350 is further increased. The other configurations are similar to those described above.

While the crystal vibrator has been described as an example of a piezoelectric vibrator in the above-described embodiment, the present invention is not limited thereto. Another piezoelectric material may be used, such as piezoelectric ceramics (for example, PZT) or zinc oxide. Also, the piezoelectric vibrator may be, for example, MEMS (Micro Electro Mechanical Systems). For example, a piezoelectric MEMS using a predetermined piezoelectric material, such as Si-MEMS, AlN, LT, or PZT may be used.

Also, while the piezoelectric vibrator has been described as an example of an electronic element in the above-described embodiment, the present invention is not limited thereto. An electronic element other than the piezoelectric vibrator may be applied as long as the electronic element is hermetically sealed by a package regardless of whether the electronic element is an active element or a passive element.

While the configuration in which the cap is formed of the plurality of metals (base member, buffer layer, and outermost layer) as an example of a lid member has been described in the above-described embodiment, the present invention is not limited thereto. That is, for example, the buffer layer may be omitted, or a plurality of buffer layers may be formed. A cap may be formed of a single-layer metal. Further, a flat-plate-shaped lid member may be applied instead of a recessed-shaped one such as a cap. In this case, an inner space for arranging an electronic element may be formed by forming the substrate of the base member in a recessed shape.

The above-described embodiments are for easily understanding the present invention, and do not intend for limitedly interpreting the present invention. The present invention may be modified and improved without departing from the idea of the present invention, and also includes its equivalents. That is, a configuration obtained by adding an appropriate design change to any of the embodiments by a person skilled in the art is included in the scope of the present invention as long as the configuration has a feature of the present invention. For example, the elements provided in the embodiments, and the arrangement, materials, conditions, shapes, and sizes of the elements are not limited to those exemplarily described, and may be appropriately changed. The respective elements provided in the respective embodiments can be combined as long as being technically possible. The combination of the elements is also included in the scope of the present invention as long as the combination has a feature of the present invention.

REFERENCE SIGNS LIST 1 piezoelectric device (electronic component)
100 piezoelectric vibrator (electronic element)
200 cap (lid member)
204 recessed portion
206 inner space
210 base member
212 buffer layer
214 outermost layer
214a solid solution layer
220 cap
224 recessed portion
223 flange portion
300 base member

The invention claimed is:

1. An electronic component comprising:
a base member having a first surface;
an electronic element mounted on the first surface of the base member;
a lid member; and
a bonding member bonding the lid member to the base member so as to hermetically seal the electronic element between the base member and the lid member,
wherein the bonding member is made of an insulating material containing a first metal,
wherein the lid member has an outermost layer on at least a surface of the lid member facing the base member, and
wherein the outermost layer of the lid member has a solid solution layer of the first metal and a second metal at at least a portion of the outermost layer.

2. The electronic component according to claim 1, wherein the solid solution layer is a solid solution diffused layer formed from the first metal of the bonding member.

3. The electronic component according to claim 1, wherein the solid solution layer is in a region of the outermost layer of the lid member which contacts the bonding member.

4. The electronic component according to claim 1, wherein the electronic element is a piezoelectric vibrator.

5. The electronic component according to claim 4, wherein an inner space defined between the base member and the lid member has a pressure lower than an atmospheric pressure.

6. The electronic component according to claim 4, wherein an inner space defined between the base member and the lid member is a vacuum.

7. The electronic component according to claim 1, wherein the insulating material is a glass material.

8. The electronic component according to claim 1, wherein the bonding member is a lead free material.

9. The electronic component according to claim 1, wherein the bonding member is in a shape of a fillet.

10. The electronic component according to claim 1, wherein the lid member includes a base layer and a buffer layer between the base layer and the outermost layer.

11. The electronic component according to claim 10, wherein the base layer of the lid member is made of a metal.

12. The electronic component according to claim 1, wherein the lid member has a recessed shape open to the first surface of the base member.

13. The electronic component according to claim 12, wherein the lid member has a flange portion extending from an opening edge of the lid member in a direction away from the center of the lid member.

14. The electronic component according to claim 1, wherein the base member has a flat plate shape.

15. The electronic component according to claim 1, wherein the first metal is silver.

16. The electronic component according to claim 1, wherein the second metal is gold or palladium.

17. A method of manufacturing an electronic component, the method comprising:
(a) preparing a base member with an electronic element mounted on a first surface of the base member, and a lid member;
(b) arranging the electronic element in an inner space that is defined between the lid member and the base member by mounting the lid member on the first surface of the base member via a bonding member, wherein the bonding member is made of an insulating material containing a first metal, and wherein the lid member has an outermost layer on at least a surface of the lid member facing the base member and containing a second metal; and
(c) bonding the lid member to the base member via the bonding member by hardening the bonding member and forming a solid solution layer at at least a portion of the outermost layer by diffusing the first metal of the bonding member in the second metal of the outermost layer.

18. The method of manufacturing the electronic component according to claim 17, wherein the solid solution layer is formed in a region of the outermost layer of the lid member which contacts the bonding member.

19. The method of manufacturing the electronic component according to claim 17, wherein the bonding member is hardened in a pressure state that is lower than an atmospheric pressure.

20. The method of manufacturing the electronic component according to claim 17, wherein the bonding member is hardened in a vacuum state.

* * * * *